United States Patent [19]

Ohno

[11] Patent Number: 5,530,726
[45] Date of Patent: Jun. 25, 1996

[54] METHOD AND APPARATUS FOR SWITCHING OF DUPLEXED CLOCK SYSTEM

[75] Inventor: Toshiaki Ohno, Tokyo, Japan

[73] Assignee: NEC Corporation, Tokyo, Japan

[21] Appl. No.: 254,559

[22] Filed: Jun. 6, 1994

[30] Foreign Application Priority Data

Jun. 18, 1993 [JP] Japan .................................. 5-147980

[51] Int. Cl.$^6$ ........................................................ H04L 7/00
[52] U.S. Cl. .......................... 375/357; 327/292; 327/293; 327/298; 331/49
[58] Field of Search .................................. 375/354, 356, 375/357, 373, 376, 260; 328/63, 61, 55, 72, 155; 327/141, 144–147, 162, 163, 292, 293, 294, 298; 331/49, 55, 2, 11, 46; 370/16, 100.1; 371/7, 8.1, 9.1

[56] References Cited

U.S. PATENT DOCUMENTS

| | | | |
|---|---|---|---|
| 4,899,351 | 2/1990 | Bonke | 375/307 |
| 5,052,030 | 9/1991 | Ernst et al. | 375/357 |
| 5,059,925 | 10/1991 | Weisbloom | 375/357 |
| 5,355,090 | 10/1994 | Pajowski et al. | 328/63 |
| 5,422,915 | 6/1995 | Byers et al. | 375/357 |

FOREIGN PATENT DOCUMENTS

| | | |
|---|---|---|
| 59-231668 | 12/1984 | Japan. |
| 169560 | 7/1987 | Japan. |
| 2-134022 | 5/1990 | Japan. |
| 2-159611 | 6/1990 | Japan. |

*Primary Examiner*—Stephen Chin
*Assistant Examiner*—Amanda T. Le
*Attorney, Agent, or Firm*—Whitham, Curtis, Whitham & McGinn

[57] ABSTRACT

A duplexed clock switching apparatus of the present invention includes two oscillators constantly working for outputting clock signals, wherein a phase of the stand-by clock signal is kept synchronized to the phase of the clock signal selected from the output signal of the oscillator to be supplied to the apparatus. Each of the duplexed clock switching apparatus of the present invention includes a clock signal generator for generating clock signals of a predetermined frequency independently; a clock selector for receiving clock signals generated by all clock signal generators and selecting one of them; a phase synchronization circuit for synchronizing a phase of a clock signal generated by the clock signal generator to the phase of the selected clock signal; and a clock switching circuit for switching an outputted clock signal to the selected clock signal. With reference to the phase synchronization circuit, it is desirable to include a phase-locked-loop (PLL) circuit.

19 Claims, 6 Drawing Sheets

METHOD AND APPARATUS FOR SWITCHING OF DUPLEXED CLOCK SYSTEM

BACKGROUND OF THE INVENTION

1. Field of the Invention

The present invention relates to a method of switching a clock signal between duplexed clock signals for supplying the clock signal stably to a duplexed information processing apparatus or a synchronous communication apparatus, and a clock signal generator to be used therefor.

2. Description of the Related Art

A duplexed clock switching system of this type has been developed with duplexed clock signal generators which are essential to the system for switching from one to another clock signal generator at stand-by when the operation is interrupted due to trouble or maintenance of the clock signal generator in use in order to supply clock signals continuously so that the operation will not be interrupted. Various kinds of systems have been disclosed.

For example, in Japanese Patent Laid-open No. 2-134022/1990 or Japanese Patent Laid-open No. 2-159611/1990, there are disclosed plans for providing a duplexed clock signal generator system by employing a crystal oscillator of high precision as a reference oscillator and outputting a signal generated by the reference oscillator and a signal produced by dividing this generated signal through a stable phase locked-loop oscillator (PLL Oscillator).

Also, in Japanese Patent Laid-open No. 59-31668/1984 or Japanese Patent Laid-open No. 62-169560/1987, there are disclosed systems which include two clock signal generating apparatus each comprising an independent clock signal generator which switch between clock signals outputted from one clock signal generator to clock signals outputted from the other clock signal generator and supplies the clock signals to each device, depending on the case.

Further, a transient free clock switch logic is disclosed in U.S. Pat. No. 4,899,351 for precluding a mixed state of both clock signals and making only one signal valid when switching from one duplexed clock signal generator to the other.

A conventional duplexed apparatus in which each of these clock signal generators are provided independently will next be described with reference to FIG. 1.

The duplexed apparatus of FIG. 1 is structured with a pair of processor systems 20, 21, each system having an independent oscillator 201 (211) for producing clock signals. Inasmuch as these two processor systems 20, 21 are of symmetrical structure to each other, one system 20 will be described below with the parts of the other system 21 indicated in parentheses ( ).

The processor system 20 (21) comprises the oscillator 201 (211); a clock gate 208 (218) which receives clock signals from its own oscillator 201 (211); a clock gate 209 (219) for receiving clock signals from the oscillator 211 (201) of the other system; a clock selection circuit, i.e., a switching circuit 203 (213) which receives output signals from two clock gates 208, 209 (218, 219) and outputs one of the received output signals; a clock selection logic circuit 204 (214) which monitors clock signals from the oscillators of the two systems 20, 21 and controls the opening/closing operation of clock gates 208, 209 (218, 219) and switching operation of clock signals to be outputted from the clock selection circuit 203 (213) according to the selected clock signal; a distribution circuit 207 (217) which receives an output signal from the clock selection circuit 203 (213); and a logic circuit 205 (215).

In a duplexed apparatus, the same clock signal is generally used in both apparatus. Therefore, when clock signals from oscillator 201 are selected, processor 20 opens its own clock gate 208 and processor 21 opens clock gate 219 which is connected to the other processor 20, and clock signals are supplied from oscillator 201 to both distribution circuits 207, 217 and the circuits disposed downstream therefrom. For switching the oscillator from 201 to 211, clock selection circuits 203, 213 are controlled by the clock selection logic circuits 204, 214 for switching, and clock gates 208, 219 are closed and clock gates 209, 218 are opened, respectively.

In the duplexed apparatus shown in FIG. 2, the two apparatus 40, 41 do not have the clock gate 208 and the like included in the apparatus shown in FIG. 1. Instead, each apparatus 40, 41 has a clock switching circuit 403, 413 for directly receiving output signals from its own oscillator and the other apparatus, and further, PLL circuits 406,416 are provided as phase synchronization means between circuits 403, 413 and the distribution circuits 407,417, respectively.

In each of the above conventional apparatus with a duplexed clock, when the frequency of the signal generated by one reference oscillator is divided by means such as a PLL circuit for duplicating the clock signal as shown in Japanese Patent Laid-open No. 2-134022/1990, no phase discrepancy of the clock signal occurs before or after switching of the clock. However, if there is a problem with the only reference oscillator provided, the apparatus cannot work as a duplexed apparatus, and therefore, the duplexing means of the above apparatus is not sufficient as a preventive measure against trouble.

Also, in the case of FIG. 1 and FIG. 2 in which oscillators are perfectly duplexed, as shown in the timing charts illustrated in FIG. 3 or FIG. 4, the pulse width may extend or the clock cycle may be shortened or lengthened at the time of switching the clock, thereby causing omission or variation in frequency of the pulse.

When the processor is duplexed, it is often necessary to establish synchronization between the two apparatus. Therefore, if there is fluctuation between clocks which are supplied to each apparatus, regular operation of the whole apparatus is not secure and hence, defective operation becomes unavoidable due to switching of the clock.

SUMMARY OF THE INVENTION

An object of the present invention is to provide a duplexed apparatus having oscillators which operate independently, and comprising a duplexed clock switching apparatus which shows no fluctuation of clocks at the time of clock switching.

In order to achieve the above object, the duplexed clock switching apparatus of the present invention comprises, in each clock signal generating means thereof, phase selection means for selecting a clock signal from either its own system or from the other system, and means for receiving a clock signal outputted from the clock generation means of the other system based on instructions of the phase selection means and generating a clock signal synchronized with the phase of the clock signal which is outputted from the clock generation means of the other system.

With the above-described configuration, the clock signal generating means of the apparatus being operated by clock signals supplied from the other apparatus can continually synchronize the clock signal generated by its own means to the clock signal supplied from the other apparatus. Therefore, when clock signals are switched, clock signals are supplied to the whole apparatus without any synchronization error.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENTS

Figure 1:
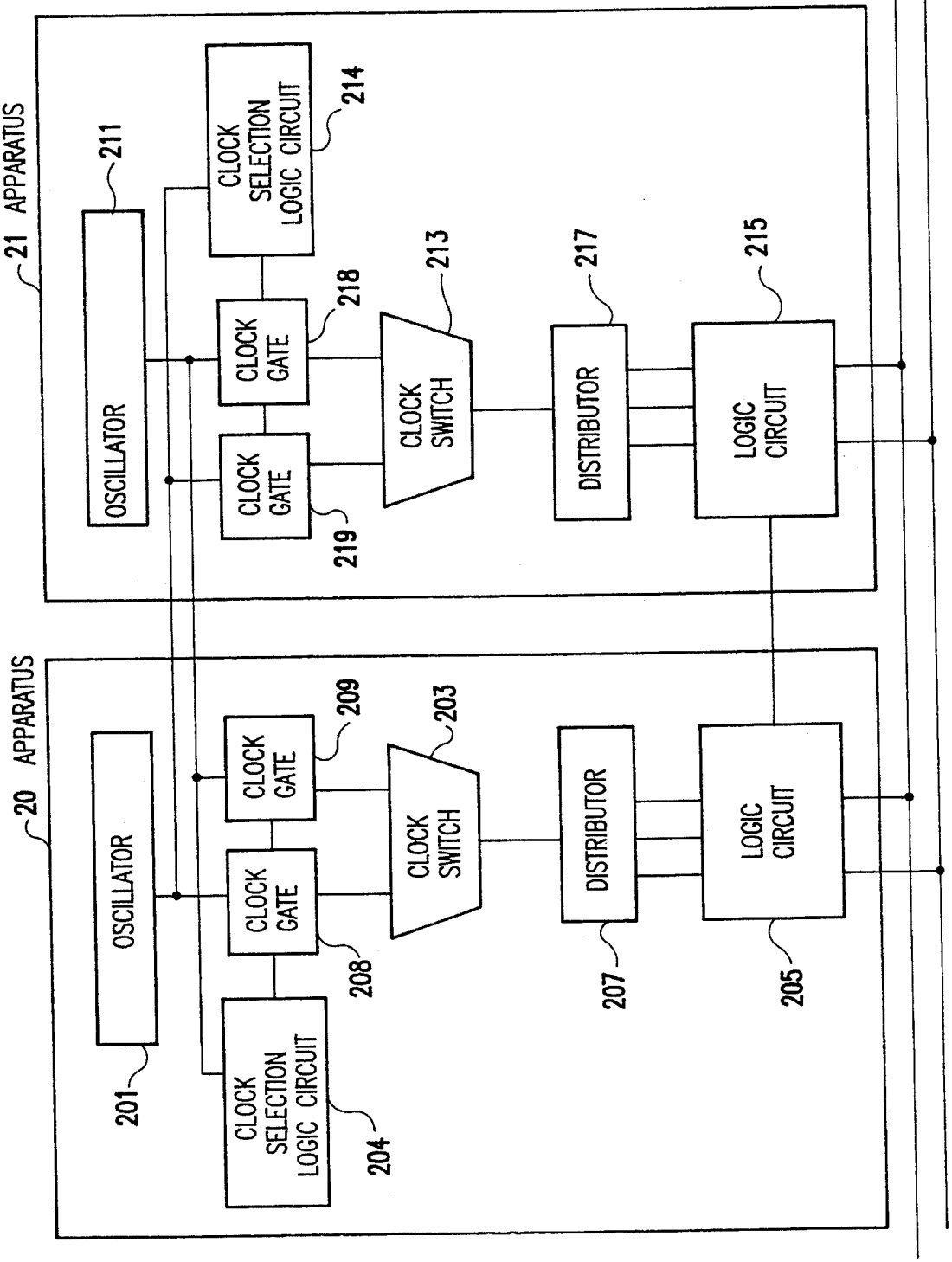
FIG. 1 is a block diagram of an embodiment of a conventional duplexed clock switching apparatus.
Figure 2:
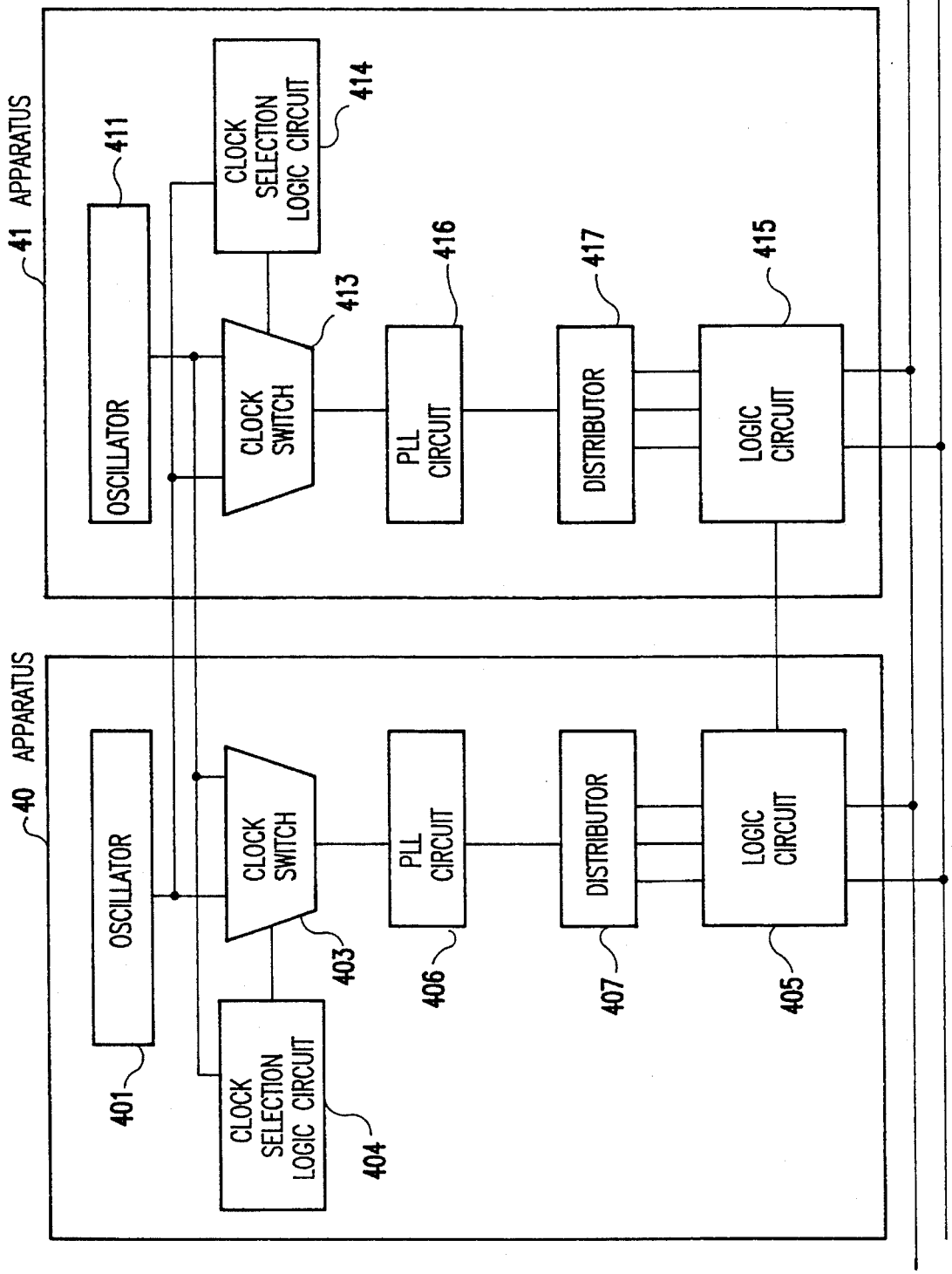
FIG. 2 is a block diagram of another embodiment of the conventional duplexed clock switching apparatus.
Figure 3:
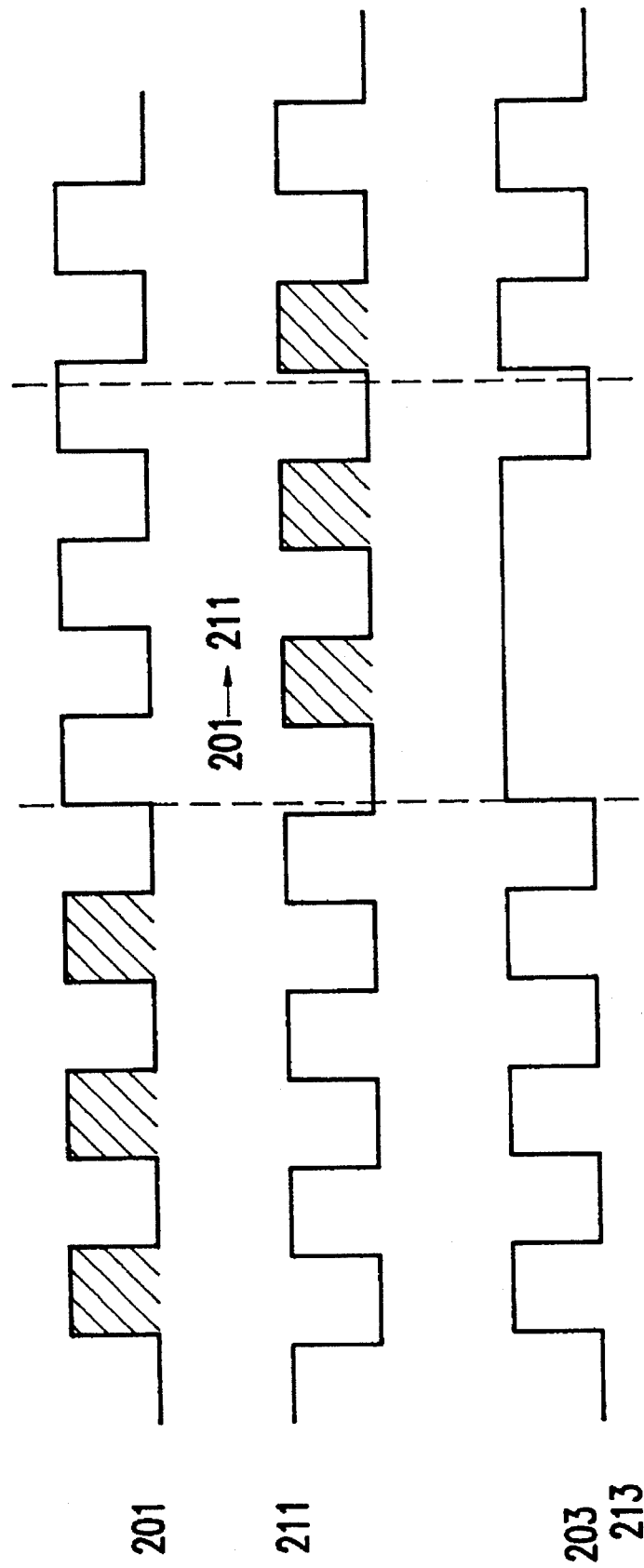
FIG. 3 is a time chart of the apparatus of FIG. 1.
Figure 4:
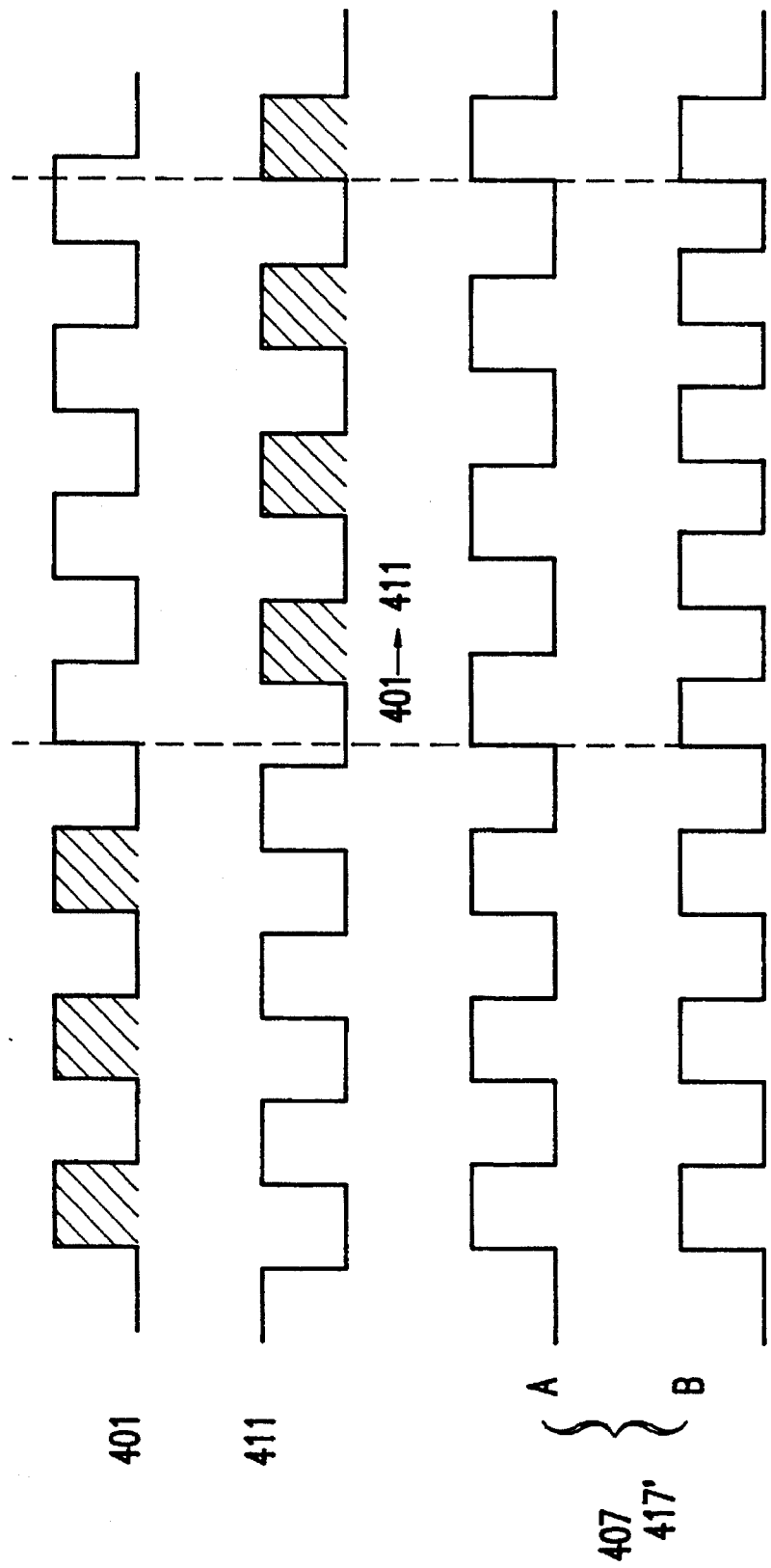
FIG. 4 is a time chart of the apparatus of FIG. 2.
Figure 5:
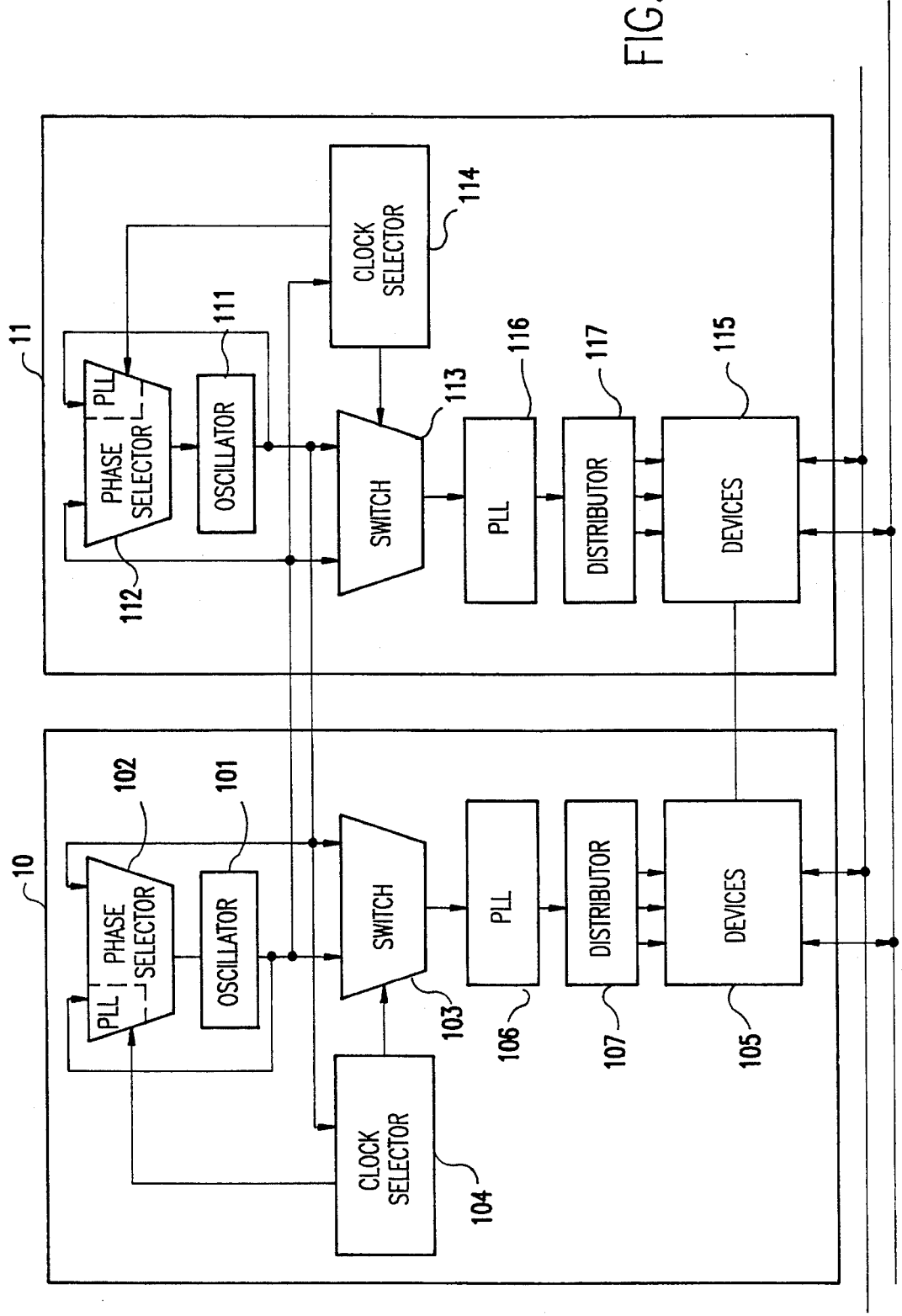
FIG. 5 is a block diagram of an embodiment of a duplexed clock switching apparatus of the present invention.

As shown in FIG. 5, the present embodiment comprises two processor systems 10, 11 each including a clock supplying circuit, which are structured symmetrically to each other. The clock supplying circuit of each processor system 10, 11 comprises:

oscillators 101, 111, respectively, each capable of independently generating a clock signal with a phase of the selected oscillator, and each including a crystal oscillator of high precision which generates a predetermined frequency;

phase selectors 102, 112, respectively, each including a PLL circuit that serves as phase synchronization means, for receiving clock signals outputted from the oscillator 101, 111 of its own or the other system and selecting one of these identical clock signals in common;

clock selector switches 103, 113, respectively, each for receiving output signals of both oscillators 101, 111; and clock selection logic circuits [i.e., clock selectors] 104, 114, respectively, for monitoring output signals from both oscillators and instructing each phase selector 102, 112 and clock selector switch 103, 113 which one of oscillators 101, 111 is to be selected.

The structure of PLL circuits 106, 116 and distribution circuits 107, 117 which receive clock signals from each clock supply circuit can be made the same as in a conventional apparatus, for example, the structure disclosed in U.S. Pat. No. 4,899,351, and the logic circuits 105, 115 may be structured asymmetrically with respect to both apparatus.

Figure 6:
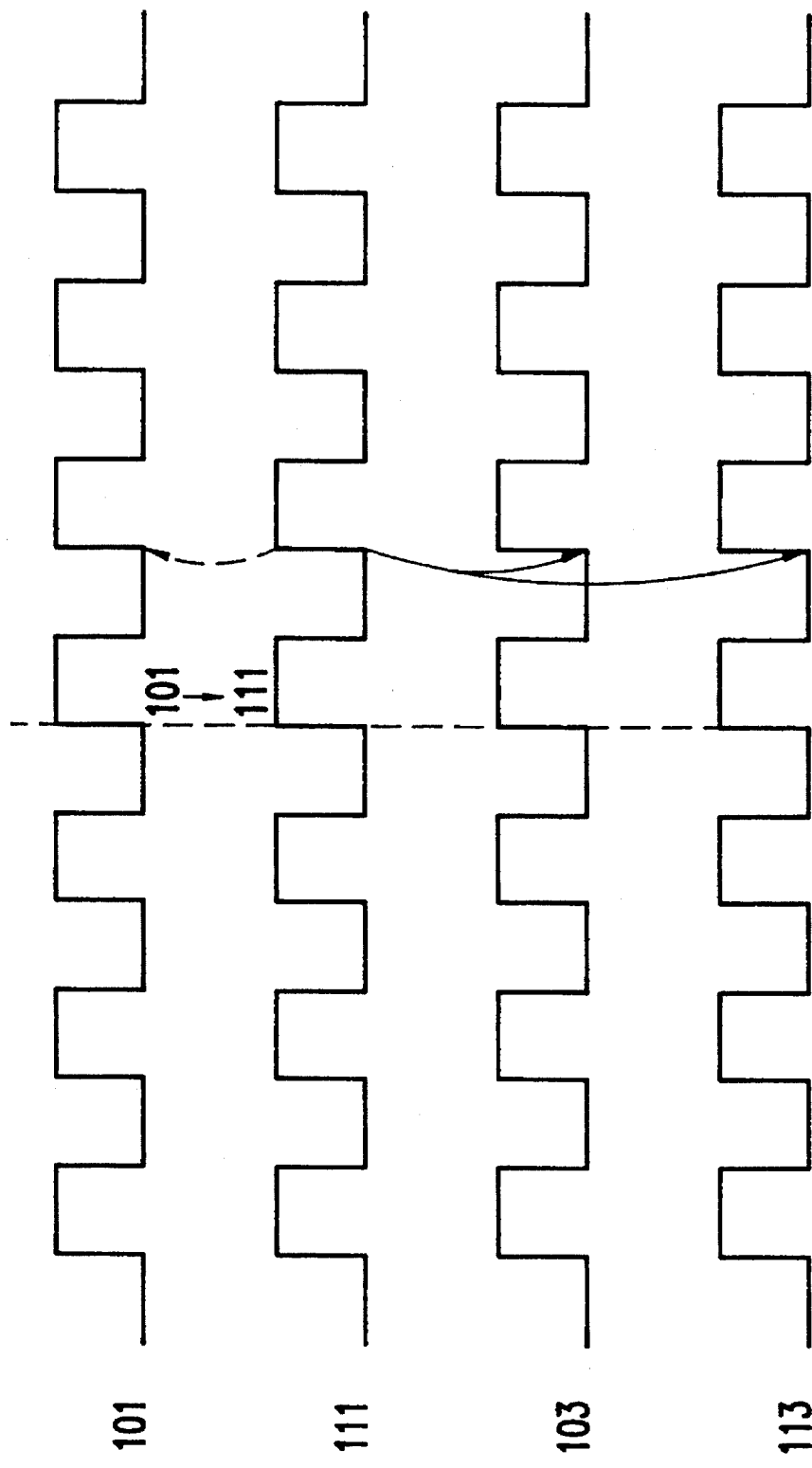
FIG. 6 is a time chart of the apparatus of FIG. 5.

Operation of the present embodiment will next be described with reference to FIG. 6.

When clock selection logic circuits 104, 114 select oscillator 101 and designate that oscillator, oscillator 101 produces and supplies one clock signal to PLL circuits 106, 116 and the whole apparatus disposed downstream therefrom. Oscillator 111 transmits a clock signal with its phase synchronized with that of the clock signal from the oscillator 101.

When oscillator 111 is selected and designated, oscillator 111 oscillates in the same manner as above and oscillator 101 produces a clock signal with the same phase as the clock signal from oscillator 111, whereby the clock signal generated by oscillator 111 is supplied to the whole apparatus.

It is to be understood that variations and modifications of the method and apparatus for switching in the duplexed clock system disclosed herein will be evident to those skilled in the art. It is intended that all such modifications and variations be included within the scope of the appended claims.

What is claimed is:

1. A method of switching a clock system of a plurality of duplexed apparatus, each of said duplexed apparatus comprising clock signal generation means for generating signals independently, clock selection means for receiving clock signals from all of the clock signal generation means and selecting one clock signal from among them, and clock switching means for switching an outputted clock signal to the clock signal selected, wherein said method comprises steps of:

generating clock signals in each apparatus respectively;

selecting a clock signal out of all of the clock signals generated by the clock signal generation means;

keeping the phase of a clock signal not selected in synchronization constantly with the phase of said selected clock signal; and outputting the selected clock signal.

2. A method according to claim 1, further comprising a step of:

providing said clock selection means with clock selection logic means for monitoring said clock signals output from said clock signal generation means and for instructing which one of said clock signals is to be selected such that when a cross-over between a first duplexed apparatus and a second duplexed apparatus occurs there is substantially no fluctuation in said clock signal selected.

3. A method according to claim 1, further comprising steps of:

providing said clock selection means with a phase-locked-loop circuit for constantly keeping the phase of said clock signal not selected in synchronization with that of said clock signal selected, and providing clock selection logic means for monitoring said clock signals output from said clock signal generation means and for instructing said phase-locked-loop circuit which one of said clock signals is to be selected.

4. A method according to claim 1, further comprising a step of:

when the selected clock signal changes from the clock signal of a first duplexed apparatus to a clock signal of a second duplexed apparatus, inputting both clock signals into each clock signal generation means so as to keep the same phase with each other.

5. A method according to claim 1, wherein the outputted clock signal has substantially no difference in phase and frequency regardless of whether it is outputted from a first duplexed apparatus or a second duplexed apparatus.

6. A method according to claim 1, wherein when the selected clock signal has changed from the clock signal of a first duplexed apparatus to a clock signal of a second duplexed apparatus, both clock signals being input into each clock signal generation means keep the same phase with each other such that the clock signal selected and applied has a same phase in a same duty cycle as the clock signal not selected, and thereby resulting in substantially no fluctuations in the selected clock signal at a time of clock switching.

7. An apparatus for switching a duplexed clock system of a plurality of duplexed apparatus, each of said duplexed apparatus comprising:

clock signal generation means for generating clock signals of a predetermined frequency independently;

clock selection means for receiving clock signals generated by all the clock signal generation means and selecting one signal from among them;

phase synchronization means for synchronizing clock signals generated by said clock signal generation means to the phase of the selected clock signal for outputting thereof; and clock switching means for switching the outputting clock signal to the clock signal selected, wherein said phase synchronization means includes a phase-locked-loop circuit for receiving clock signals outputted from said clock signal generation means and for maintaining said phase of a clock signal not selected in substantially constant synchronization with that of the selected clock signal.

8. An apparatus according to claim 7, further comprising clock selection logic means for monitoring said clock signals output from said clock signal generation means and for instructing which one of said clock signals is to be selected.

9. An apparatus according to claim 7, wherein said phase synchronization means includes a phase-locked-loop circuit for constantly keeping the phase of said clock signal not selected in synchronization with that of said clock signal selected, further comprising clock selection logic means for monitoring said clock signals output from said clock signal generation means and for instructing said phase synchronization means which one of said clock signals is to be selected.

10. An apparatus according to claim 7, wherein when the selected clock signal has changed from the clock signal of a first duplexed apparatus to a clock signal of a second duplexed apparatus, both clock signals being input into each clock signal generation means keep the same phase.

11. An apparatus according to claim 7, wherein the outputted clock signal has no difference in phase and frequency regardless of whether it is outputted from a first duplexed apparatus or a second duplexed apparatus.

12. An apparatus according to claim 7, wherein said phase synchronization means includes a phase-locked-loop circuit for constantly maintaining a phase of the clock signal not selected with that of the selected clock signal such that when the selected clock signal has changed from the clock signal of a first duplexed apparatus to a clock signal of a second duplexed apparatus, and wherein both clock signals input into each clock signal generation means keep the same phase with each other such that the clock signal of the second duplexed apparatus has a same phase in a same duty cycle as that of the clock signal of the first duplexed apparatus, and thereby resulting in substantially no fluctuations in the selected clock signal at a time of clock switching.

13. An apparatus for switching a duplexed clock system of a plurality of duplexed apparatus each of said duplexed apparatus comprising:

clock signal generation means for generating clock signals of a predetermined frequency independently;

clock selection means for receiving clock signals generated by all the clock signal generation means and selecting one signal from among them;

phase synchronization means for synchronizing clock signals generated by said clock signal generation means to the phase of the selected clock signal for outputting thereof; and clock switching means for switching the outputting clock signal to the clock signal selected, wherein said phase synchronization means comprises a phase-locked-loop circuit which synchronizes a phase of a clock signal generated by clock signal generation means of its own apparatus to the phase of said selected clock signal for outputting thereof.

14. An apparatus according to claim 13, further comprising clock selection logic means for monitoring said clock signals output from said clock signal generation means and for instructing which one of said clock signals is to be selected.

15. An apparatus according to claim 13, wherein said phase-locked-loop circuit constantly keeps the phase of said clock signal not selected in synchronization with that of said clock signal selected, further comprising clock selection logic means for continually monitoring said clock signals output from said clock signal generation means and for instructing said phase synchronization means which one of said clock signals is to be selected.

16. An apparatus according to claim 13, wherein when the selected clock signal changes from the clock signal of a first duplexed apparatus to a clock signal of a second duplexed apparatus, both clock signals being input into each clock signal generation means keep the same phase with each other.

17. An apparatus according to claim 13, wherein the outputted clock signal has no difference in phase and frequency regardless of whether it is outputted from a first duplexed apparatus or a second duplexed apparatus.

18. An apparatus according to claim 13, wherein said clock selection means includes clock selection logic means for continually monitoring output signal from said clock signal generation means and for instructing said phase synchronization means which one of said clock signals is to be selected.

19. An apparatus according to claim 13, wherein said phase-locked-loop circuit constantly maintains a phase of the clock signal not selected with that of the selected clock signal such that when the selected clock signal has changed from the clock signal of a first duplexed apparatus to a clock signal of a second duplexed apparatus, and wherein both clock signals input into each clock signal generation means keep the same phase with each other such that the clock signal of the second duplexed apparatus has a same phase in a same duty cycle as that of the clock signal of the first duplexed apparatus, and thereby resulting in substantially no fluctuations in the selected clock signal at a time of clock switching.

* * * * *